(12) United States Patent
Bilodeau et al.

(10) Patent No.: US 10,290,505 B2
(45) Date of Patent: May 14, 2019

(54) PASSIVATION OF GERMANIUM SURFACES

(71) Applicant: Entegris, Inc., Billerica, MA (US)

(72) Inventors: Steven Bilodeau, Oxford, CT (US); Emanuel I. Cooper, Scarsdale, NY (US); Hsing-Chen Wu, Hsinchu (TW); Min-Chieh Yang, Hsinchu (TW)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/752,640

(22) PCT Filed: Aug. 12, 2016

(86) PCT No.: PCT/US2016/046793
§ 371 (c)(1),
(2) Date: Feb. 14, 2018

(87) PCT Pub. No.: WO2017/030967
PCT Pub. Date: Feb. 23, 2017

(65) Prior Publication Data
US 2018/0240674 A1 Aug. 23, 2018

Related U.S. Application Data

(60) Provisional application No. 62/205,319, filed on Aug. 14, 2015.

(51) Int. Cl.
*H01L 21/02* (2006.01)
*H01L 21/28* (2006.01)
*H01L 21/762* (2006.01)

(52) U.S. Cl.
CPC .. *H01L 21/28255* (2013.01); *H01L 21/02381* (2013.01); *H01L 21/02532* (2013.01); *H01L 21/02664* (2013.01); *H01L 21/762* (2013.01)

(58) Field of Classification Search
CPC ......... H01L 21/02381; H01L 21/02532; H01L 21/02664; H01L 21/28255; H01L 21/762
See application file for complete search history.

(56) References Cited

U.S. PATENT DOCUMENTS

| | | | | |
|---|---|---|---|---|
| 2005/0106893 A1* | 5/2005 | Wilk | ............. | C23C 16/0245 438/758 |
| 2007/0093074 A1* | 4/2007 | Frank | ............. | H01L 21/02046 438/778 |
| 2014/0027884 A1* | 1/2014 | Tang | ............. | H01L 23/293 257/632 |
| 2015/0118834 A1 | 4/2015 | Loh et al. | | |
| 2016/0155637 A1* | 6/2016 | Mader | ............. | C23C 18/1204 257/618 |

FOREIGN PATENT DOCUMENTS

CN 104241116 12/2014

OTHER PUBLICATIONS

Cai et al., "1-Dodecanethiol based highly stable self-assembled monolayers for germanium passivation," Jul. 11, 2015, vol. 353, pp. 890-901*
Sioncke, S. et al.; "Passivation Challenges with Ge and III/V devices"; ECS Transactions, 2012, vol. 45, No. 4, pp. 97-110.
Sioncke, S. et al.; "S-passivation of the Ge gate stack:Tuning the gate stack properties by changing the atomic layer seposition oxidant precursor", Journal of Applied Physics, 2011, vol. 110, No. 8, Article No. 084907, internal pp. 1-8, Pub. Apr. 12, 2012.
Khairnar, Anil G. et al.; "Surface passivation of germanium using NH3 ambient in RTP for high mobility MOS structure"; Journal of Non- and Electronic Physics, 2013, vol. 5, No. 2, Article No. 02009, internal pp. 1-3, Pub. May 4, 2013.
Hallman, H. et al.; "Simple, robust molecular self-assembly on germanium"; Chemical Science, 2011, 2, pp. 1334-1343.

* cited by examiner

*Primary Examiner* — Allan R Wilson
(74) *Attorney, Agent, or Firm* — Entegris, Inc.

(57) ABSTRACT

Compositions useful for the passivation of germanium-containing materials on a microelectronic device having same thereon.

17 Claims, No Drawings

PASSIVATION OF GERMANIUM SURFACES

CROSS-REFERENCE TO RELATED APPLICATIONS

This application is filed under the provisions of 35 U.S.C. § 371 claiming priority of International Patent Application No. PCT/US2016/046793 filed on Aug. 12, 2016 entitled, "PASSIVATION OF GERMANIUM SURFACES" that claims priority to U.S. Provisional Patent Application No. 62/205,319 filed Aug. 14, 2015 in the name of Steven Bilodeau et al. entitled "PASSIVATION OF GERMANIUM SURFACES" each of which is incorporated by reference herein in their entirety.

FIELD

The present invention relates to a composition and process for passivating germanium-containing materials on the surface of a microelectronic device.

DESCRIPTION OF THE RELATED ART

For the past several decades, the scaling of features in integrated circuits has enabled increased densities of functional units on a semiconductor chip. For example, shrinking transistor size allows for the incorporation of an increased number of memory devices on a chip, leading to the fabrication of products with increased capacity.

In the manufacture of metal oxide semiconductor field effect transistors (MOSFETs) for integrated circuit devices, semiconducting crystalline materials other than silicon may be advantageous. An example of one such material is Ge, which offers a number of potentially advantageous features relative to silicon, such as, but not limited to, high charge carrier (hole) mobility, band gap offset, a different lattice constant, and the ability to alloy with silicon to form semiconducting binary alloys of SiGe.

One problem with the use of Ge in modern transistor designs is that the extremely fine features (e.g., 22 nm and below) that are now achieved for silicon FETs aggressively scaled over the years are now difficult to achieve in Ge, often making potential material-based performance gains a wash when implemented in less-aggressively scaled forms. For example, the performance of MOSFETS is strongly affected by electrically active defects at the channel gate dielectric interface. In devices with a silicon channel, low interface trap density (Dit) can be achieved by careful formation of a thin oxide on the channel surface. For devices with a germanium channel, low Dits are not readily achievable by this oxidation process.

An object of the present invention is to provide compositions for the passivation of germanium-containing surfaces on the microelectronic device. Without being bound by theory, it is thought that the formation of surface layers on germanium-containing surfaces, i.e., passivation, will suppress oxidation at the germanium-containing surface and provide low interface trap densities.

SUMMARY OF THE INVENTION

The present invention relates to a composition and process for passivating germanium-containing surfaces on a microelectronic device comprising same.

In one aspect, a method of passivating a germanium-containing material on the surface of a microelectronic device is described, said method comprising contacting the microelectronic device comprising the germanium-containing material with a passivation composition comprising water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions that passivate germanium-containing materials on the surface of a microelectronic device.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Silicon" may be defined to include, Si, polycrystalline Si, and monocrystalline Si. Silicon is comprised in silicon-on-insulator (SOI) wafers that may be used, for example, as substrates or part of a substrate for electronic devices such as FETs and integrated circuits. Other types of wafers may also comprise silicon.

As used herein, "silicon-containing materials" correspond to silicon; p-doped silicon; n-doped silicon; silicon oxide, including gate oxides (e.g., thermally or chemically grown $SiO_2$) and TEOS; silicon nitride; thermal oxide; SiOH; SiCOH; titanium silicide; tungsten silicide; nickel silicides; cobalt silicides; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As described herein, the "silicon oxide" or "$SiO_2$" material corresponds to materials that were deposited from a silicon oxide precursor source, e.g., TEOS, thermally deposited silicon oxide, or carbon doped oxides (CDO) deposited using commercially available precursors such as SiLK™ AURORA™, CORAL™, or BLACK DIAMOND™. For the purposes of this description, "silicon oxide" is meant to broadly include $SiO_2$, CDO's, siloxanes and thermal oxides. Silicon oxide or $SiO_2$ material corresponds to pure silicon oxide ($SiO_2$) as well as impure silicon oxide including impurities in the structure.

As defined herein, the "germanium-containing materials" may be a bulk germanium wafer, n-doped germanium, p-doped germanium, a germanium-on-insulator (GOI) wafer in which case the layer is a germanium layer formed on a dielectric layer on top of the substrate, and a germanium layer on a substrate. The germanium-containing material can be a continuous layer that at least partially extends over the substrate or can be divided into separate regions. It should be appreciated that for the purpose of this application, germanium-containing materials also can include silicon-germanium (SiGe) alloys having the general formula $Si_{1-x}Ge_x$, wherein the content of Ge is greater than about 70 wt %, more preferably greater than 80 wt %, and most preferably greater than 90 wt %.

As used herein, "about" is intended to correspond to ±5% of the stated value.

As defined herein, "high-k dielectric" materials correspond to: hafnium oxides (e.g., $HfO_2$); zirconium oxides (e.g., $ZrO_2$); hafnium oxysilicates; hafnium silicates; zirconium silicates; titanium silicates; aluminum oxides; lanthanum-doped analogous thereof (e.g., $LaAlO_3$); aluminum silicates; titanates (e.g., $Ta_2O_5$); oxides and nitrides of hafnium and silicon (e.g., HfSiON); lanthanum-doped analogues thereof (e.g., HFSiON (La)); barium strontium titanate (BST); oxides of hafnium and aluminum (e.g., $Hf_xAl_yO_z$); strontium titanate ($SrTiO_3$); barium titatnate ($BaTiO_3$); and combinations thereof.

As used herein, the "passivation" of the germanium-containing materials on the surface of a microelectronic device corresponds to the formation of at least one surface layer on the germanium-containing surface.

In a first aspect, a passivation composition for passivating a germanium-containing material on the surface of a microelectronic device and a method of using same is described, said passivation composition comprising, consisting of, or consisting essentially of water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof.

Where necessary, the at least one surface active compound may need to be dissolved in a co-solvent. Suitable co-solvent species for such passivation composition include, without limitation: tetramethylene sulfone; straight-chained or branched $C_1$-$C_6$ alcohols including, but not limited to, methanol, ethanol, 1-propanol, 2-propanol, 1-butanol, 2-butanol, t-butanol, 1-pentanol, hexanol, cyclohexanol, 2-ethyl-1-hexanol; benzyl alcohol, furfuryl alcohol; glycols such as ethylene glycol, diethylene glycol, propylene glycol (1,2-propanediol), tetramethylene glycol (1,4-butanediol), 2,3-butanediol, 1,3-butanediol, and neopentyl glycol; or glycol ethers such as diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, and tripropylene glycol n-butyl ether. Other solvents that are useful are typical polar solvents such dimethylacetamide, formamide, dimethylformamide, 1-methyl-2-pyrrolidinone, dimethyl sulfoxide, tetrahydrofurfuryl alcohol (THFA), and other polar solvents. Combinations of two or more co-solvent species are also contemplated herein.

Without being bound by theory, it is thought that the surface active compounds are strongly attracted to the germanium-containing material surface and remain there after rinsing. For example, a sulfur-based passivation layer may form on the germanium-containing material surface if the surface active compound comprises sulfur, e.g., disulfides, dithiols, sulfites, thioethers, thiols, thioalcohols, thioglycols, ortho-hydroxythiophenols, or a selenium-based passivation layer may form on the germanium-containing material surface if the surface active compound comprises selenium, e.g., selenides. Surface active compounds contemplated herein include, but are not limited to, alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof. For example, the at least one surface active compound can be selected from the group consisting of alpha hydroxy acid (e.g., 2-hydroxy-n-octanoic acid), amine (e.g., taurine, thiourea), azole (e.g., imidazole, 1-hexyl-3-methylimidazolium chloride, 1,2,4-triazole, 1-dodecylimidazole, N-octylimidazole, 1-octylbenzimidazole, 1-(n-butyl)imidazole, 1-methylimidazole, 4-methylimidazole), carboxylic acid (e.g., mandelic acid, pyruvic acid, 2-oxooctanoic acid, phenylglyoxilic acid, 2-hydroxyoctanoic acid), diol (e.g., 1,2-butanediol, 1,2-hexanediol), disulfide (e.g., p-tolyl disulfide, dibenzyl dithioether, benzyl dithioether, propyldisulfide, cystamine dihydrochloride, eithiodiglycolic acid, 2, 2'-dithiodipyridine), dithiol (e.g., 3,6-dioxa-1,8-octanedithiol, bis(2-mercaptoethyl) ether, heptaethylene glycol dithiol, tetraethylene glycol dithiol, bis(2-mercaptoethyl) 3,3'-thiodipropionate, bis(2-mercaptoethyl) thioether), selenide (e.g., selenium dioxide), sulfite (e.g., ammonium sulfite), thioether (e.g., 2,2'-thiodiacetic acid, 3,3'-thiodipropionic acid, dicetyl thiodipropionate, thioanisole (methyl phenyl thioether), bis(2-ethylhexyl) 3,3'-thiodipropionate, di(tridecyl) thiodipropionate, dilauryl thiodipropionate, diphenyl thioether, dimethyl 3,3'-dithiodipropionate, diethyl 3,3'-dithiodipropionate, dimethyl 3,3'-trithiodipropionate, diisobutyl 3,3'-thiodipropionate, thiodiphenol, didodecyl thiodipropionate, diisooctyl 3,3'-dithiodipropionate, dimethyl 3,3'-thiodipropionate, 1,3 dithiane, diethyl 3,3'-thiodipropionate, bis(2,3-dihydroxypropyl) 3,3'-dithiodipropionate, bis(2,3-dihydroxypropyl) 3,3'-thiodipropionate, dibutyl 3,3'-thiodipropionate, phenyl dithioether, lauryl stearyl 3,3'-thiodipropionate, dimyristyl thiodipropionate, dioleyl 3,3'-thiodipropionate, dioctadecyl thiodipropionate, dioctyltin-3,3'-thiodipropionate, distearyl 3,3'-dithiopropionate, distearyl thiodipropionate, 3,3'-thiodipropionic acid, 1,3,4-Thiadiazole-2,5-dithiol), thiol (e.g., methyl thioglycolate, 1-octanethiol, 1-dodecanethiol, 1-decanethiol, 6-mercaptohexanoic acid, cyclohexanethiol, 1-heptanethiol, 9-mercaptofluorene, biphenyl-4-thiol, thioglycolic acid, 11-mercapto-1-undecanol, 2-naphtalenethiol, thiobenzoic acid, methimazole, cysteine), thioalcohols and thioglycols (e.g., 2-mercaptoethanol, 1-mercapto-2-propanol, 3-mercapto-1-propanol, 1-thioglycerol) and ortho-hydroxythiophenols (e.g., 2-hydroxythiophenol). Preferably, the surface active compound is selected from the group consisting of 3,3'-thiodipropionic acid, 2,2'-thiodiacetic acid, 3,6-dioxa-1,8-octanedithiol, methyl thioglycolate, and combinations thereof. The concentration of the at least one surface active compound in the passivation composition is in a range from about 0.00001 wt % to about 10 wt %, based on the total weight of the passivation composition.

It will be appreciated that it is common practice to make concentrated forms of the passivation compositions to be diluted prior to use. For example, the passivation compositions may be manufactured in a more concentrated form and thereafter diluted with additional water at the manufacturer, before use, and/or during use at the fab. Dilution ratios may be in a range from about 0.1 part diluent:1 part passivation composition concentrate to about 100 parts diluent:1 part passivation composition concentrate.

The passivation compositions described herein are easily formulated by simple addition of the respective ingredients and mixing to homogeneous condition. The concentrations of the respective ingredients may be widely varied in specific multiples of the passivation composition, i.e., more dilute or more concentrated, and it will be appreciated that the passivation compositions can variously and alternatively comprise, consist or consist essentially of any combination of ingredients consistent with the disclosure herein.

In a second aspect, a method of passivating a germanium-containing material on the surface of a microelectronic device, said method comprising contacting the microelectronic device comprising the germanium-containing material with a passivation composition comprising, consisting of, or consisting essentially of water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof, as described herein. The passivation composition is contacted in any suitable manner to the surface of the microelectronic device, e.g., by spraying the passivation composition on the surface of the device, by dipping (in a static or dynamic volume of the passivation composition) of the device, by contacting the device with another material, e.g., a pad, or fibrous sorbent applicator element, that has the passivation composition absorbed thereon, by contacting the device with a circulating passivation composition, or by any other suitable means, manner or technique, by which the passivation composition is brought into removal contact with the germanium-containing materials. The application may be in a batch or single wafer apparatus, for dynamic or static cleaning.

In use of the passivation compositions described herein, the passivation composition typically is contacted with the device structure for a sufficient time of from about 10 seconds to about 100 minutes, preferably about 30 second to about 30 minutes, at temperature in a range of from about 20° C. to about 100° C., preferably about 20° C. to about 40° C. Such contacting times and temperatures are illustrative, and any other suitable time and temperature conditions may be employed that are efficacious to achieve the required passivation.

Following the achievement of the desired passivation, the excess passivation composition can be readily removed from the microelectronic device to which it has previously been applied, e.g., by rinse, wash, or other removal step(s), as may be desired and efficacious in a given end use application of the passivation compositions of the present invention. For example, the device may be rinsed with a rinse solution including deionized water and/or dried (e.g., spin-dry, $N_2$, vapor-dry etc.). Alternatively, the rinse can be substantially non-aqueous, e.g., isopropyl alcohol (IPA), followed by a drying step (e.g., spin-dry, $N_2$, vapor-dry etc.). Following the rinse, molecules from the at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof, as described herein, are thought to be adsorbed (i.e., chemically and/or physically) on the germanium-containing material.

In one embodiment of the second aspect, the method of passivating a germanium-containing material on the surface of a microelectronic device comprises:
contacting the microelectronic device comprising the germanium-containing material with an oxide-removal composition; and
contacting the microelectronic device comprising the germanium-containing material with a passivation composition,
wherein said passivation composition comprises, consists of, or consists essentially of water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof, as described herein. The oxide-removal composition includes, but is not limited to, a hydrofluoric acid solution, a hydrochloric acid solution, an $HCl/H_2O_2/$water solution (i.e., SC-2), and a $NH_4OH/H_2O_2/$water solution (i.e., SC-1). An optional rinsing step may occur between the contact with the oxide-removal composition and the contact with the passivation composition.

In another embodiment of the second aspect, the method of passivating a germanium-containing material on the surface of a microelectronic device comprises:
contacting the microelectronic device comprising the germanium-containing material with an oxide-removal composition;
contacting the microelectronic device comprising the germanium-containing material with a passivation composition;
rinsing the microelectronic device comprising the germanium-containing material; and
drying the microelectronic device comprising the germanium-containing material,
wherein said passivation composition comprises, consists of, or consists essentially of water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof, as described herein. The oxide-removal composition includes, but is not limited to, a hydrofluoric acid solution, a hydrochloric acid solution, an $HCl/H_2O_2/$water solution (i.e., SC-2), and a $NH_4OH/H_2O_2/$water solution (i.e., SC-1). An optional rinsing step may occur between the contact with the oxide-removal composition and the contact with the passivation composition.

In still another embodiment, the method of passivating a germanium-containing material on the surface of a microelectronic device comprises:
contacting the microelectronic device comprising the germanium-containing material with an oxide-removal composition;
contacting the microelectronic device comprising the germanium-containing material with a passivation composition;
rinsing the microelectronic device comprising the germanium-containing material;
drying the microelectronic device comprising the germanium-containing material; and
depositing a high-k dielectric material on the microelectronic device comprising the germanium-containing material,
wherein said passivation composition comprises, consists of, or consists essentially of water and at least one surface active compound selected from the group consisting of alpha hydroxy acids, amines, azoles, carboxylic acids, diols, disulfides, dithiols, selenides, sulfites, thioethers, thiols, thioalcohols, thioglycols, ortho-hydroxythiophenols, and combinations thereof, as described herein. The oxide-removal composition includes, but is not limited to, a hydrofluoric acid solution, a hydrochloric acid solution, an $HCl/H_2O_2/$ water solution (i.e., SC-2), and a $NH_4OH/H_2O_2/$water solution (i.e., SC-1). An optional rinsing step may occur between the contact with the oxide-removal composition and the contact with the passivation composition.

Another aspect of the invention relates to an article of manufacture comprising, consisting of or consisting essentially of a microelectronic device substrate, a germanium-containing material, and a passivation composition as described herein.

The features and advantages of the invention are more fully shown by the illustrative examples discussed below.

Example 1

A p-type germanium substrate doped with gallium with a resistivity of 0.02 ohm-cm and an n-type germanium substrate with a resistivity of 0.04 ohm-cm were cleaned using the following six step oxide-removal process:
1. $HCl/H_2O_2/H_2O$ (100:1:500) rinse for 20 s
2. DIW rinse
3. $NH_4OH/H_2O_2/H_2O$ (1:1:100) rinse for 40 s
4. DIW rinse
5. 4% HF rinse for 1 minute
6. DIW rinse The germanium substrates were then exposed to a passivation composition comprising one of ammonium sulfide (1% in water), methyl thioglycolate (1% in water), 3,6-dioxa-1,8-octanedithiol (1% in DMSO) for five minutes, followed by a DIW rinse and a nitrogen dry. All processing was done at ambient temperature. Photoluminescence (PL) was measured using illumination from a 625 nm, 700 mW photodiode. The integrated PL intensities are shown in Table 1 below. Surface defects result in non-radiative recombination and lower PL intensities. The higher PL intensity for methyl thioglycolate is evidence that it is more effective than ammonium sulfide for surface passivation.

TABLE 1

| Formulation Description | 1600 nm-2000 nm Integrated PL Intensity (arb. Units) | |
|---|---|---|
| | p-type | n-type |
| $(NH_4)_2S$ (1% in water) | 6.64E−06 | 5.36E−06 |
| Methyl Thioglycolate (1% in water) | 8.48E−06 | 2.81E−05 |
| 3,6-dioxa-1,8-octanedithiol (1% in DMSO) | 3.62E−06 | 1.38E−05 |

Example 2

A p-type germanium substrate doped with gallium with a resistivity of 0.02 ohm-cm was subjected to the following process:
1. Cleaned using acetone followed by isopropanol
2. Exposed to the passivation composition comprising one of ammonium sulfide (1% in water), 3,3'-thiodipropionic acid (1% in water), 2,2'-thiodiacetic acid (1% in water), 3,6-dioxa-1,8-octanedithiol (1% in DMSO) for 20 minutes
3. DI water rinsed
4. Nitrogen blow dry
5. 10 pulses of trimethyl aluminium (in an ALD reactor)
6. ALD 100 cycles of $Al_2O_3$ using trimethyl aluminium at 250° C.
7. 450° C. anneal for 2 minutes in nitrogen
8. Ni/Au top electrode deposition through a shadow mask
9. Ti/Au ohmic contact to the bottom of the Ge substrate
10. Post metal anneal (300° C., 30 s in nitrogen)
11. Capacitance versus voltage measurements.

The capacitance versus voltage measurements were made at 25 frequencies between 100 Hz and 1 MHz with gate voltages between 2.25 and −2.25 volts. These measurements were modeled to extract the density of interface states. Results for several formulations are given below. 3,3'-thiodipropionic acid, shows both a lowering of Dit with no Q-time and less increase in Dit with a 24 hour Q-time. 2,2'-thiodiacetic acid shows a lower Dit with a 24 hour queue time than ammonium sulfide. For p-type Ge 3,6-dioxa-1,8-octanedithiol and methyl thioglycolate show less frequency dispersion than ammonium sulfide with comparable Dit and hysteresis.

TABLE 2

| Surface Passifying chemical | Q-time | Dit ($eV^{-1}cm^{-2}$) @Ev + 0.42 eV | Frequency dispersion | Hysteresis | Substrate |
|---|---|---|---|---|---|
| ammonium sulfide (1% in water) | 0 | $2.3 \times 10^{12}$ | 1.46% | 115 mV | N—Ge, Sb-doped, 1E17 |
| ammonium sulfide (1% in water) | 24 | $2.6\text{-}2.75 \times 10^{12}$ | 1.55%-1.9% | 117-120 mV | N—Ge, Sb-doped, 1E17 |
| 3,3'-Thiodipropionic acid (1% in water) | 0 | $2.0 \times 10^{12}$ | 1.72% | 113 mV | N—Ge, Sb-doped, 1E17 |
| 3,3'-Thiodipropionic acid (1% in water) | 24 | $2.3 \times 10^{12}$ | 1.70% | 110 mV | N—Ge, Sb-doped, 1E17 |
| 2,2'-Thiodiacetic acid (1% in water) | 24 | $2.5\text{-}2.55 \times 10^{12}$ | 1.6%-1.8% | 116-123 mV | N—Ge, Sb-doped, 1E17 |
| ammonium sulfide (1% in water) | 0 | $2.25\text{-}4.5 \times 10^{12}$ | 0.7%-0.68% | 59-74 mV | p-Ge, Ga-doped, 0.02 Ω-cm |
| 3,6-dioxa-1,8-octanedithiol (1% in DMSO) | 0 | $2.25 \times 10^{12}$ | 0.60% | 60 mV | p-Ge, Ga-doped, 0.02 Ω-cm |
| Methyl Thioglycolate | 0 | $4.25 \times 10^{12}$ | 0.66% | 61 mV | p-Ge, Ga-doped, 0.02 Ω-cm |

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of passivating a germanium-containing material on the surface of a microelectronic device, said method comprising contacting the microelectronic device comprising the germanium-containing material with a passivation composition comprising water and at least one surface active compound selected from the group consisting of alpha hydroxy acids, amines, azoles, carboxylic acids, diols, disulfides, dithiols, selenides, sulfites, thioethers, thioalcohols, thioglycols, orthohydroxythiophenols, and combinations thereof.

2. The method of claim 1, wherein the contacting comprises a method selected from the group consisting of spraying the passivation composition on the surface of the device, dipping the device in the passivation composition, contacting the device with another material that has the passivation composition absorbed thereon, and contacting the device with a circulating passivation composition.

3. The method of claim 1 wherein the at least one surface active compound comprises at least one species selected from the group consisting of 2-hydroxy-n-octanoic acid, taurine, thiourea, imidazole, 1-hexyl-3-methylimidazolium chloride, 1,2,4-triazole, 1-dodecylimidazole, N-octylimidazole, 1-octylbenzimidazole, 1-(n-butyl)imidazole, 1-methylimidazole, 4-methylimidazole, mandelic acid, pyruvic acid, 2-oxooctanoic acid, phenylglyoxilic acid, 2-hydroxyoctanoic acid, 1,2-butanediol, 1,2-hexanediol, p-tolyl disulfide, dibenzyl dithioether, benzyl dithioether, propyldisulfide, cystamine dihydrochloride, eithiodiglycolic acid, 2, 2'-dithiodipyridine, 3,6-dioxa-1,8-octanedithiol, bis(2-mercaptoethyl) ether, heptaethylene glycol dithiol, tetraethylene glycol dithiol, bis(2-mercaptoethyl) 3,3'-thiodipropionate, bis (2-mercaptoethyl) thioether, selenium dioxide, ammonium sulfite, 2,2'-thiodiacetic acid, 3,3'-thiodipropionic acid, dicetyl thiodipropionate, thioanisole (methyl phenyl thioether), bis(2-ethylhexyl) 3,3'-thiodipropionate, di(tridecyl) thiodipropionate, dilauryl thiodipropionate, diphenyl thioether, dimethyl 3,3'-dithiodipropionate, diethyl 3,3'-dithiodipropionate, dimethyl 3,3'-trithiodipropionate, diisobutyl 3,3'-thiodipropionate, thiodiphenol, didodecyl thiodipropionate, diisooctyl 3,3'-dithiodipropionate, dimethyl 3,3'-thiodipropionate, 1,3 dithiane, diethyl 3,3'-thiodipropionate, bis(2,3-dihydroxypropyl) 3,3'-dithiodipropionate, bis(2,3-dihydroxypropyl) 3,3'-thiodipropionate, dibutyl 3,3'-thiodipropionate, phenyl dithioether, lauryl stearyl 3,3'-thiodipropionate, dimyristyl thiodipropionate, dioleyl 3,3'-thiodipropionate, dioctadecyl thiodipropionate, dioctyltin-3,3'-thiodipropionate, di stearyl 3,3'-dithiopropionate, distearyl thiodipropionate, 3,3'-thiodipropionic acid, 1,3,4-Thiadiazole-2,5-dithiol, methyl thioglycolate, 6 mercaptohexanoic acid, 9 mercaptofluorene, thioglycolic acid, 11-mercapto-1-undecanol, thiobenzoic acid, methimazole, cysteine, 2-mercaptoethanol, 1-mercapto-2-propanol, 3-mercapto-1-propanol, 1-thioglycerol, 2-hydroxythiophenol, and combinations thereof.

4. The method of claim 1, wherein the passivation composition further comprises at least one co-solvent, wherein the at least one co-solvent comprises a species selected from the group consisting of tetramethylene sulfone, methanol, ethanol, 1-propanol, 2-propanol, 1-butanol, 2-butanol, t-butanol, 1-pentanol, hexanol, cyclohexanol, 2-ethyl-1-hexanol, benzyl alcohol, furfuryl alcohol, ethylene glycol, diethylene glycol, propylene glycol (1,2-propanediol), tetramethylene glycol (1,4-butanediol), 2,3-butanediol, 1,3-butanediol, neopentyl glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, dimethylacetamide, formamide, dimethylformamide, 1-methyl-2-pyrrolidinone, dimethyl sulfoxide, tetrahydrofurfuryl alcohol (THFA), and combinations thereof.

5. The method of claim 1, wherein the contacting comprises time from about 10 seconds to about 100 minutes.

6. The method of claim 1, wherein the contacting comprises temperature from about 20° C. to about 100° C.

7. The method of claim 1, further comprising contacting the microelectronic device comprising the germanium-containing material with an oxide-removal composition prior to contacting with the passivation composition.

8. The method of claim 7, wherein the oxide-removal composition comprises a hydrofluoric acid solution, a hydrochloric acid solution, an HCl/H2O2/water solution, or a NH4OH/H2O2/water solution.

9. The method of claim 1, further comprising rinsing the microelectronic device comprising the germanium-containing material following contact with the passivation composition.

10. The method of claim 9, further comprising drying the microelectronic device comprising the germanium-containing material following the rinsing.

11. The method of claim 10, further comprising depositing a high-k dielectric material on the microelectronic device comprising the germanium-containing material following the drying.

12. The method of claim 1, wherein the germanium-containing materials comprise at least one of a bulk germanium wafer, n-doped germanium, p-doped germanium, a germanium-on-insulator (GOI) wafer, a germanium layer on a substrate, and silicon-germanium (SiGe) alloys having the general formula Si1−xGex, wherein the content of Ge is greater than about 70 wt %.

13. The method of claim 12, wherein the content of Ge is greater than 80 wt %.

14. The method of claim 12, wherein the content of Ge is greater than 90 wt %.

15. The method of claim 5, wherein the wherein the contacting comprises time from about 30 seconds to about 30 minutes.

16. The method of claim 6, wherein the contacting comprises temperature from about 20° C. to about 40° C.

17. A method of passivating a germanium-containing material on the surface of a microelectronic device, said method comprising contacting the microelectronic device comprising the germanium-containing material with a passivation composition comprising water and at least one surface active compound, wherein the contacting comprises time from about 10 seconds to about 100 minutes and wherein the at least one surface active compound is 3,3'-thiodipropionic acid, 2,2'-thiodiacetic acid, 3,6-dioxa-1,8-octanedithiol, methyl thioglycolate, or combinations thereof.

* * * * *